United States Patent [19]
Engh et al.

[11] Patent Number: 6,035,049
[45] Date of Patent: Mar. 7, 2000

[54] AC COUPLING AND SIGNAL AMPLIFICATION USING SWITCHED CAPACITORS

[75] Inventors: Lawrence D. Engh, Redwood City; Jung Sheng Hoei, Newark; Vashal Sarin, Santa Clara, all of Calif.

[73] Assignee: Information Storage Devices, Inc., San Jose, Calif.

[21] Appl. No.: 08/924,215

[22] Filed: Sep. 5, 1997

[51] Int. Cl.$^7$ ...................................................... H03F 21/00
[52] U.S. Cl. .............................. 381/121; 381/98; 330/109
[58] Field of Search .................................... 381/120, 121, 381/28, 98; 330/110, 109

[56] References Cited

U.S. PATENT DOCUMENTS

| | | | |
|---|---|---|---|
| 4,387,345 | 6/1983 | Kelley ........................................... | 330/9 |
| 4,558,292 | 12/1985 | Sasaki et al. ............................. | 333/173 |
| 5,736,896 | 4/1998 | Sakishita et al. ........................ | 327/554 |

OTHER PUBLICATIONS

"Single Chip Voice Message System, Preliminary Specifications", Information Storage Devices, Inc., Aug. 1991.
"ISD1012A/1016A/1020A Single–Chip Voice Record/Playback Devices Data Sheet", Information Storage Devices, Nov. 1992.

*Primary Examiner*—Ping Lee
*Attorney, Agent, or Firm*—Blakely, Sokoloff, Taylor & Zafman LLP

[57] ABSTRACT

AC coupling and signal amplification using switched capacitors. The use of a switched capacitor to simulate a resistor in amplifier coupling in an integrated circuit processing audio frequency signals avoids the need for external components, reducing cost and eliminating the need for pinouts for the external components. In a system including an anti-aliasing filter, capacitive coupling is used for coupling between amplifiers, with the gain of the second amplifier being set by a feedback capacitor between the amplifier output and its input, as sized relative to the coupling capacitor. The switched capacitor in the feedback loop of the second amplifier preferably couples the output of the anti-aliasing filter back to the amplifier input, thereby minimizing the aliasing from the capacitor switching.

9 Claims, 4 Drawing Sheets

AC COUPLING AND SIGNAL AMPLIFICATION USING SWITCHED CAPACITORS

BACKGROUND OF THE INVENTION

1. Field of the Invention

The present invention relates to the field of integrated circuits devoted at least in part to the processing of analog signals of relatively low frequencies, such as voice signals.

2. Prior Art

The preferred embodiment of the present invention is intended for use in analog signal storage and playback devices of the type manufactured by Information Storage Devices, Inc. of San Jose, Calif. These analog storage and playback devices are single integrated circuits for receiving an analog signal in the audio range, typically from a microphone or other audio signal input device, and storing successive samples of the audio signal during record, and for later providing an output signal, typically to a speaker, representing the successive playback of the stored audio signal samples. In that regard, as used herein, the phrase "audio signal" is used generally to refer to electronic signals in a typical voice frequency band, but includes other types of such signals, such as analog signals representing music, sound effects, alarms, or other signals having similar low frequency cut-off. In that regard, the present invention is directed toward problems associated with integrating analog processing circuits having relatively low, low frequency cut-off using all on-chip components.

FIG. 1 is a simplified block diagram illustrating typical audio signal processing in a system wherein the analog signal is to be periodically sampled and stored in non-volatile memory for later playback, in the case of the Information Storage Devices, Inc. products, by storage of the analog signal sample itself, and in other storage systems by digitizing the analog sample and storing the digitized value of the sample in digital form. In either case, an input device 20 such as a microphone is used to provide an input to a preamplifier 22, the output of which is capacitively coupled through capacitor C1 to amplifier 24. The output of the amplifier 24 controls an automatic gain control circuit 26 to adjust the gain of the preamplifier 22 to hold the output of amplifier 24 substantially constant, independent of the amplitude of the signal provided to the preamplifier. Because of the subsequent sampling, an anti-aliasing filter 28, typically an analog anti-aliasing filter, is coupled to the output of amplifier 24 to limit the upper end of the bandpass of the analog signal consistent with the sampling rate used. In the prior art double-ended preamplifier, amplifier and anti-aliasing circuits were used.

Since the typical voice frequency range runs from approximately 100 hertz to a few kilohertz, a large RC time constant is required to implement the appropriate low frequency pole in the frequency response of the audio signal path. By way of example, a pole at 150 hertz would require an RC time constant of 1 millisecond. To achieve this time constant, a realistic monolithic resistor of 100K ohms would require a capacitor of $10^4$ picofarads. Alternatively, a realistic monolithic capacitor of 10 picofarads would require a resistor of 100 Mohms. Therefore, in the prior art, the AC coupling is usually done with an on-chip resistor, but with an external capacitor. The gain of the amplifier is usually controlled by a resistance ratio using on-chip resistors.

FIG. 2 illustrates the typical connection of the amplifier. The capacitor C1 is an off-chip capacitor having a value on the order of 1 $\mu$f, with the on-chip resistors R1 and R2 having values in the order of tens of Kohms. The capacitor C1 and input resistor R1 define the low frequency pole, and the resistor ratio R2/R1 defines the gain of the amplifier.

The prior art circuit just described is both simple and functional. However, it also has certain disadvantages not limited to, but particularly important in, very low cost and/or miniature systems. One disadvantage, of course, is the size and expense of the external capacitor, which in turn increases size and cost of the printed circuit board or whatever other circuit packaging technique is used, and of course also increases the size of the final packaged system. Further, the connection between the preamplifier and amplifier of FIG. 1 need not be available to the outside world except for the use of the external capacitor, and accordingly, the prior art technique of using the external capacitor requires two more bonding pads on each integrated circuit die, increasing the size of the die and perhaps the integrated circuit package, depending on how the same is packaged. Consequently, overall cost and size considerations make the use of the external capacitor undesirable, particularly in low cost and/or miniature systems. Further, while one can reasonably control the ratio of resistors obtained during integrated circuit fabrication, the absolute magnitude of a particular resistance is not well controllable. Thus, the low frequency pole is not well controlled using an external capacitor, as the pole is determined by the combination of the external capacitor and an internal resistor value. The internal resistor itself can vary as much as 30 percent, to which the tolerance of the external capacitor must be added. Thus, it would be highly desirable to have both the coupling capacitor and the associated resistor on-chip to avoid the requirement of bringing out the two additional connections from the integrated circuit and the increased size and expense resulting from the inclusion of the external capacitor.

It is also known in the prior art that a capacitor may be switched to simulate a resistor. A typical switched capacitor circuit is shown in FIG. 3, wherein capacitor C has one end connected to a fixed voltage such as ground, and the other end connected to two switches, SW and $\overline{SW}$ operating in a non-overlapping complementary manner so that both switches are not closed at the same time.

In this circuit, when switch SW is closed, capacitor C adjusts its charge so that $q_1 = CV_1$. When switch SW opens and then switch $\overline{SW}$ closes, the charge on the capacitor will readjust through the output $V_2$ to $q_2 = CV_2$. Thus the charge delivered to the output $V_2$ from the input $V_1$ is equal to $q_1 - q_2 = C(V_1 - V_2)$. If this is repeated N times per second, then the charge transfer per second, or current i, will be $dq/dt = i = NC(V_1 - V_2)$. Thus on average, the capacitor looks like a resistor between $V_1$ and $V_2$, passing a current proportional to the voltage difference $V_1 - V_2$ with an apparent resistance equal to $1/NC$.

BRIEF SUMMARY OF THE INVENTION

AC coupling and signal amplification using switched capacitors. The use of a switched capacitor to simulate a resistor in amplifier coupling in an integrated circuit processing audio frequency signals avoids the need for external components, reducing cost and eliminating the need for pinouts for the external components. In a system including an anti-aliasing filter, capacitive coupling is used for coupling between amplifiers, with the gain of the second amplifier being set by a feedback capacitor between the amplifier output and its input, as sized relative to the coupling capacitor. The switched capacitor in the feedback loop of the second amplifier preferably couples the output of the anti-aliasing filter back to the amplifier input, thereby minimizing the aliasing from the capacitor switching. Alternate embodiments are disclosed.

DETAILED DESCRIPTION OF THE INVENTION

Figure 1:
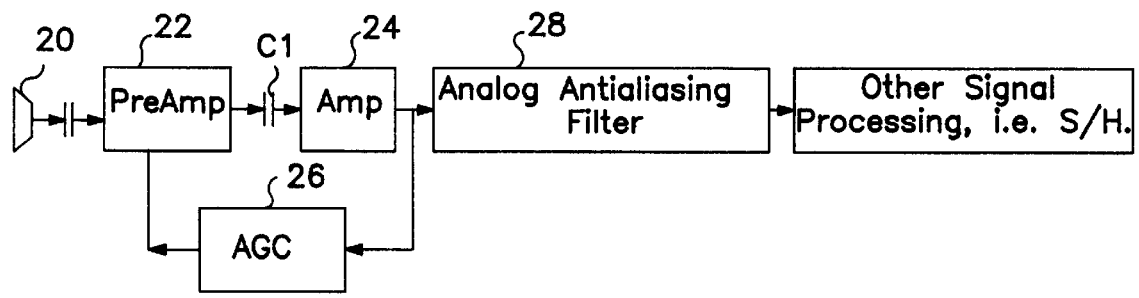
FIG. 1 is a block diagram illustrating typical audio signal processing in a system wherein the analog signal is to be periodically sampled and stored in non-volatile memory for later playback.
Figure 2:
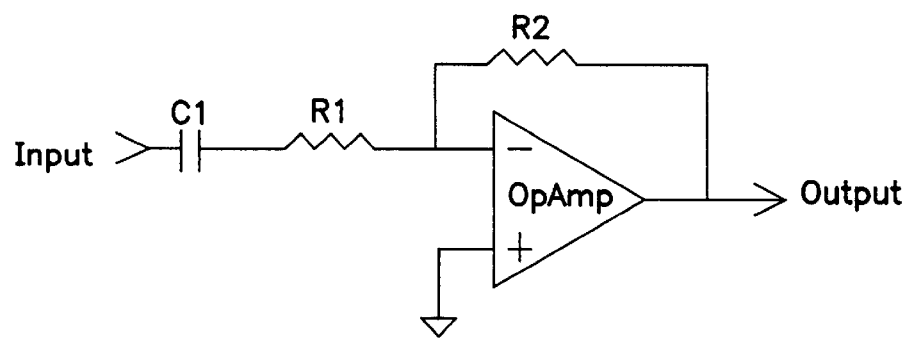
FIG. 2 illustrates the typical prior art coupling between the preamplifier and the amplifier in an audio system.
Figure 3:
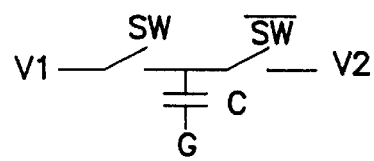
FIG. 3 illustrates a typical prior art switched capacitor circuit.
Figure 4:
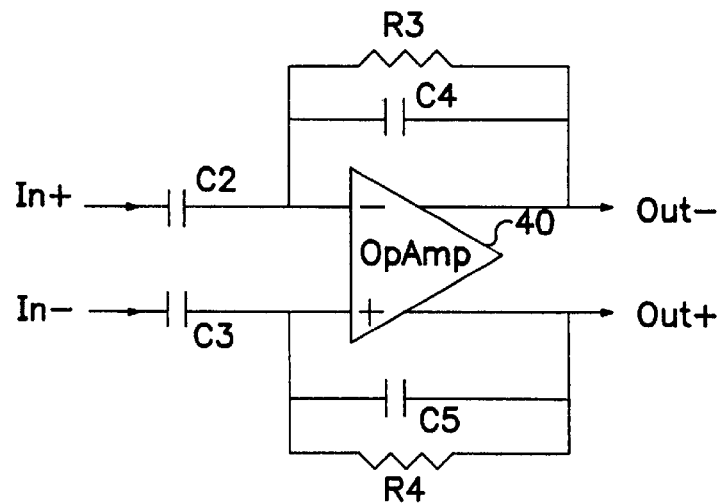
FIG. 4 is an equivalent circuit for the present invention.

In the preferred embodiment of the present invention, a double ended amplifier is used for the preamplifier 22 and amplifier 24 of FIG. 1. Further, rather than use a series RC connection for the input to the amplifier, a capacitively coupled differential input is used, with a parallel RC connection in the feedback of each differential output. The equivalent circuit for this connection may be seen in FIG. 4. Here, amplifier 40 has the differential input thereto coupled through capacitors C2 and C3, with the two legs each having feedback through a parallel connected resistance and capacitance, namely resistor R3 and capacitor C4 for the positive output OUT+, and resistor R4 and capacitor C5 for the negative differential output OUT−. In a typical implementation, of course, capacitors C2 and C3 would be equal, capacitors C4 and C5 would be equal, and resistors R3 and R4 would be equal. With the connection shown in FIG. 2, the gain of the amplifier, assuming a high open loop gain, is equal to R2/R1, with the input having a time constant of R1C1. With the connection shown in FIG. 4, the gain of the amplifier is equal to C2/C4. Resistors R3 and R4 are needed however, to provide DC feedback, as any leakage at the amplifier input or mismatch in the amplifier could force the amplifier into saturation. In the case of FIG. 4, the time constant is R3C4 (equals R4C5). Using the same characteristic low frequency roll-off of 150 Hz as the circuit of FIG. 2, a reasonable capacitance for capacitors C4 and C5 of 1 pf would require resistors of 1000 Mohm, impractical for an on-chip resister. Thus, the connection of FIG. 4 is characterized by the same difficulty as that of FIG. 2, namely for the desired low frequency roll-off for the audio signal, a practical value for monolithic resistors R3 and R4 would yield an impractical value for monolithic capacitors C4 and C5, and practical values for monolithic capacitors C4 and C5 would yield impractical values for monolithic resistors R3 and R4.

Figure 5:
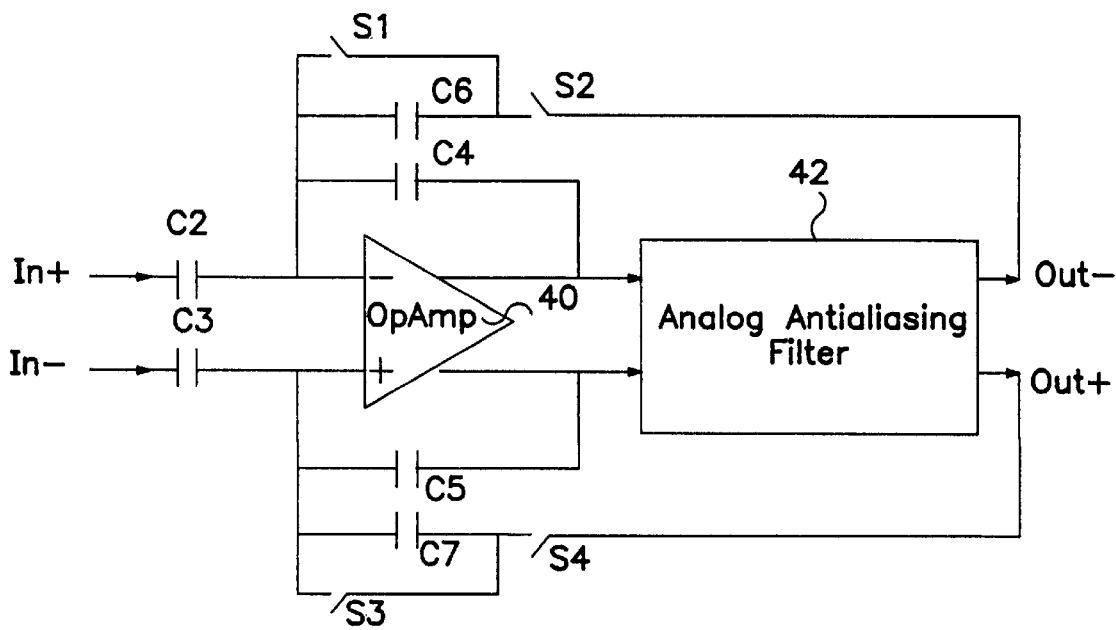
FIG. 5 is a circuit diagram for the switched capacitor resistors in the feedback circuit of a double ended amplifier in accordance with the preferred embodiment of the present invention.

Accordingly, in the present invention, resistors R3 and R4 of FIG. 4 are replaced by switched capacitors C6 and C7 of FIG. 5, together with associated switches S1 and S2, and S3 and S4, respectively. Also, as may be seen therein, the gain determining feedback capacitors C4 and C5 are coupled directly from the respective amplifier 40 output to the corresponding amplifier input, whereas the switched capacitors C6 and C7 provide the resistive feedback not directly from the amplifier output, but rather from the output of the analog anti-aliasing filter 42. The gain determining capacitors C4 and C5 are connected directly to the amplifier output, as the gain for the frequency components in the bandpass of the amplifier should be determined before some of those frequency components, namely the higher frequency components which would cause an aliasing problem for the subsequent sample and hold circuits, are filtered from the amplifier output by the analog anti-aliasing filter. If the feedback for gain determining purposes were taken from the output of the anti-aliasing filter, then the higher frequency components which would be substantially attenuated by the filter would merely be amplified by the amplifier with a higher gain in an attempt to maintain the gain of these components at the filter output, contrary to the desired function of the filter. (In practice, the phase shift in the anti-aliasing filter would probably yield a severe stability problem, so that consideration of taking the gain determining feedback from the output of the filter is likely theoretical only.)

In order to minimize the generation of noise or beat frequencies, it is preferable to operate the switched capacitors at the analog sample frequency or harmonics thereof. In the preferred embodiment, the sample frequency of the analog storage and playback system and of the switched capacitors is nominally 6.4 KHz. For a low frequency pole at 150 Hz, capacitors C4 and C5 are 1 picofarad and capacitors C6 and C7 are 0.15 picofarads. Since the sampling clock in such systems is typically quite accurate, and with a good IC layout, capacitors can be matched to within 0.1%, the low frequency pole is well controlled, and also easily tunable by changing the clock frequency.

In principle, the switched capacitor resistors could be used to replace the resistors R3 and R4 in FIG. 4 to provide switched capacitor feedback directly from the output of the amplifier 40 back to the input. However, unless the input to the amplifier has already been suitably band limited, aliasing distortion will occur. Since an anti-aliasing filter usually exists in this type of system, and normally acts on the output of the amplifier, the switched capacitors may be connected to the output of the filter in the proper polarity such that the switched capacitors sample the band limited signal instead of sampling the continuous signal from the output of the amplifier. Therefore, the undesired higher frequency signal components which would have aliased back to the passband will have already been attenuated by the filter.

With respect to stability of the amplifier using the filter output as the source of the feedback for the switched capacitors, the phase shift caused by the anti-aliasing filter will vary over the passband of the filter and will be quite substantial at the upper end of the passband. However, at the upper end of the passband, the feedback is dominated by capacitors C4 and C5, rather than by the switched capacitors, so that the amplifier will be stable and the gain will be substantially unaffected by the phase of the feedback through the switched capacitors. At the lower frequencies, however, such as at 150 Hz and lower, the switched capacitor feedback will start to dominate. However, the phase shift in the anti-aliasing filter at these lower frequencies normally is quite low and relatively constant, so that amplifier stability will be maintained by simply providing the switched capacitor feedback of the proper polarity.

Figure 6:
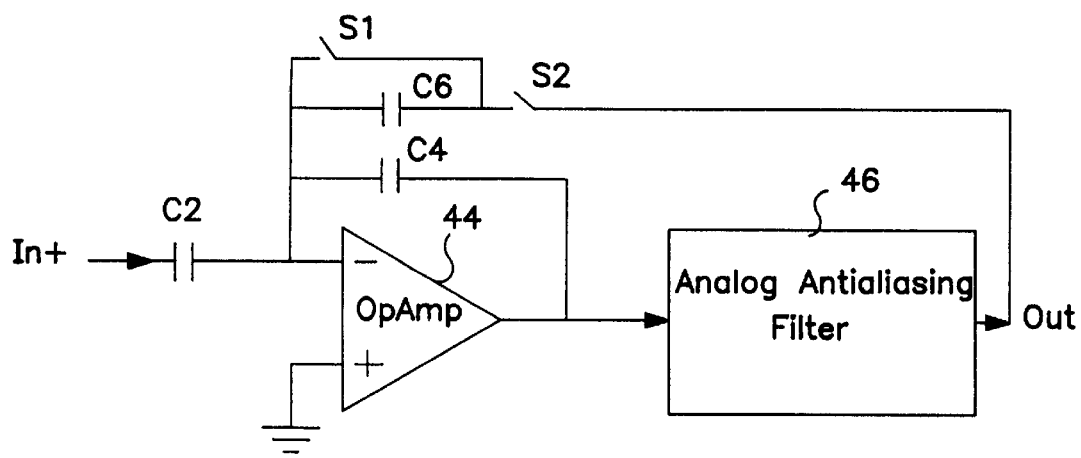
FIG. 6 is a circuit diagram for the switched capacitor resistor in the feedback circuit of a single ended amplifier in accordance with an alternate embodiment of the present invention.
Figure 7:
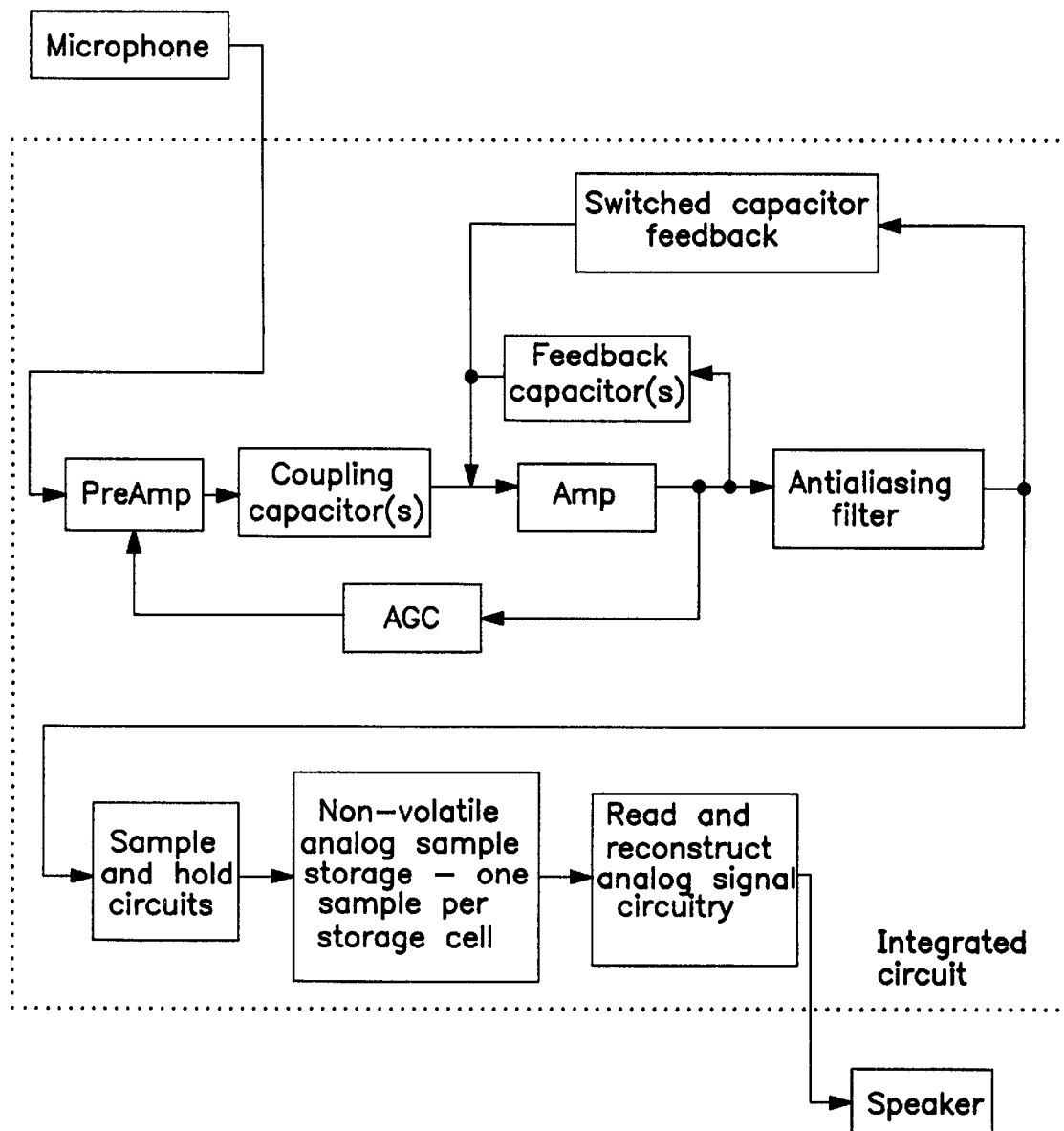
FIG. 7 is an overall block diagram of an analog storage and playback system incorporating the present invention.

Now referring to FIG. 7, an overall block diagram of an analog storage and playback system incorporating the present invention may be seen. As shown in this Figure, the integrated circuit includes the preamplifier, the coupling capacitor or capacitors (capacitors C2 and C3 of FIGS. 4 and 5 or capacitor C2 of FIG. 6), the amplifier (amplifier 40 of FIGS. 4 and 5, or amplifier 44 of FIG. 6), with the automatic gain control AGC providing the gain adjustment for the preamplifier. Also included is the feedback capacitor or capacitors (capacitors C4 and C5 of FIGS. 4 and 5, or capacitor C4 of FIG. 6), the anti-aliasing filter (filter 42 of FIG. 5, or filter 46 of FIG. 6) with the switched capacitor feedback (switches S1 through S4 and capacitors C6 and C7 of FIG. 5, or switches S1 and S2 and capacitor C6 of FIG. 6).

The present invention, of course, is intended to be used in conjunction with an analog storage and playback system of the general type heretofore manufactured and sold by Information Storage Devices, Inc., assignee of the present invention. Accordingly, also on chip are sample and hold circuits for sampling the analog output of the anti-aliasing filter at a predetermined sample rate or frequency, a non-volatile analog sample storage array, in the preferred embodiment a floating gate array, for storing one analog sample per storage cell, as well as circuitry for reading and reconstructing the analog signal on command. The only major components to be provided off chip, other than power, is a microphone which may be directly coupled or capacitively coupled by an off chip capacitor to the preamplifier, depending upon the type of microphone used, and a speaker or other output device for using the reconstructed analog signal. Details of the sample and hold circuit, non-volatile analog sample storage, one sample per storage cell, and the read and reconstruct analog signal circuitry are not described in detail herein, as the general design and operation of the same is well detailed in the prior art, particularly the prior art patents also owned by Information Storage Devices, Inc. In the preferred embodiment of the present invention, the read and reconstruct analog circuitry also includes an amplifier and anti-aliasing circuitry, together with coupling capacitors, feedback capacitors and switched capacitor feedback of the same characteristics as that of the input to the sample and hold circuits of FIG. 7.

While the preferred embodiment of the present invention is used in a double ended system, the same is also directly applicable to a single ended system, such as shown in FIG. 6. Here the amplifier 44 has the positive input grounded, with negative capacitive feedback being provided by capacitor C4. The output of the anti-aliasing filter 46 is used to provide the switched capacitor feedback, the gain and low frequency pole being determined in the same manner as hereinbefore described with respect to the embodiment of FIG. 5.

While certain preferred embodiments of the present invention have been disclosed and described herein, it will be understood by those skilled in the art that various changes in form and detail may be made therein without departing from the spirit and scope of the invention.

What is claimed is:

1. In an analog signal processing system, the improvement comprising:

first and second amplifiers for amplifying audio frequency signals, each having an input and an output;
an anti-aliasing filter having an input and an output;
the output of the first amplifier being coupled to the input of the second amplifier through a first capacitor;
the output of the second amplifier being coupled to the input of the anti-aliasing filter, and to the input of the second amplifier through a second capacitor providing negative feedback thereto;
the output of the anti-aliasing filter being coupled to the input of the second amplifier through a switched capacitor providing negative feedback thereto, the second capacitor and the switched capacitor providing a low frequency pole in the frequency response of the amplifiers.

2. The improvement of claim 1 wherein the first amplifier is a variable gain preamplifier.

3. The improvement of claim 1 wherein the low frequency pole is at approximately 150 Hz.

4. In an analog signal processing system which includes circuitry for sampling an analog signal at a sample frequency and storing the samples, one sample per storage cell, and for reading the stored samples and reconstructing the analog signal, the improvement comprising:

first and second amplifiers for amplifying audio frequency signals, each having an input and an output;
the output of the first amplifier being coupled to the input of the second amplifier through a first capacitor;
the output of the second amplifier being coupled to the input of the second amplifier through a second capacitor providing negative feedback thereto;
the output of the second amplifier being coupled to the input of the second amplifier through a switched capacitor, the second capacitor and the switched capacitor providing a low frequency pole in the frequency switched capacitors;
wherein, the improvement further comprising an anti-aliasing filter having an input and an output, the input of the anti-aliasing filter being coupled to the output of the second amplifier, the switched capacitor being coupled to the output of the second amplifier through the anti-aliasing filter.

5. The improvement of claim 4 wherein the switching frequency of the switched capacitor is a frequency selected from the group of frequencies consisting of the sample frequency of the sample and hold circuits and harmonics thereof.

6. The improvement of claim 4 wherein the switching frequency of the switched capacitor is a frequency selected from the group of frequencies consisting of the sample frequency of the sample and hold circuits and harmonics thereof.

7. The improvement of claim 6 wherein the switching frequency of the switched capacitor is the sample frequency of the sample and hold circuits.

8. The improvement of claim 7 wherein the first amplifier is a variable gain preamplifier.

9. The improvement of claim 8 wherein the low frequency pole is at approximately 150 Hz.

* * * * *